(12) United States Patent
Deas

(10) Patent No.: US 6,269,455 B1
(45) Date of Patent: Jul. 31, 2001

(54) SYSTEM AND A METHOD FOR PROCESSING INFORMATION ABOUT LOCATIONS OF DEFECTIVE MEMORY CELLS AND A MEMORY TEST WITH DEFECT COMPRESSION MEANS

(75) Inventor: Alexander Roger Deas, Scotland (GB)

(73) Assignee: Acuid Corporation Limited, Guernsey (GB)

( * ) Notice: Subject to any disclaimer, the term of this patent is extended or adjusted under 35 U.S.C. 154(b) by 0 days.

(21) Appl. No.: 09/101,332

(22) PCT Filed: Nov. 7, 1997

(86) PCT No.: PCT/GB97/03007

§ 371 Date: Jul. 7, 1998

§ 102(e) Date: Jul. 7, 1998

(87) PCT Pub. No.: WO98/20497

PCT Pub. Date: May 14, 1998

(30) Foreign Application Priority Data

Nov. 7, 1996 (GB) .................................................. 9623215

(51) Int. Cl.$^7$ ................................................ G06F 11/00
(52) U.S. Cl. ................................................ 714/29; 713/8
(58) Field of Search ................................. 714/8, 5, 723, 714/701, 711, 710, 719, 29; 365/201

(56) References Cited

U.S. PATENT DOCUMENTS

| | | | |
|---|---|---|---|
| 4,628,509 | * 12/1986 | Kawaguchi | 714/711 |
| 5,173,906 | 12/1992 | Dreibelbis et al. | 371/22.5 |
| 5,317,573 | 5/1994 | Bula et al. | 371/10.3 |
| 5,754,556 | * 5/1998 | Ramseyer | 714/25 |
| 6,026,505 | * 2/2000 | Hedberg | 714/711 |

OTHER PUBLICATIONS

Hansen, Peter "Testing Conventional Logic and Memory Clusters Using Boundry Scan Devices as Virtual ATE Channels" 1989 International Test Conference, IEEE, Paper 7.1, p. 166–173.*

International Search Report.

* cited by examiner

Primary Examiner—Robert Beausoleil
Assistant Examiner—Bryce Bonzo
(74) Attorney, Agent, or Firm—Sughrue, Mion, Zinn, Macpeak & Seas, PLLC

(57) ABSTRACT

A system for reducing or obviating the requirement for a large amount of defect capture memory in memory test and analysis systems by compressing test results. The compression means system reduces or replaces the fault capture memory in the test system or workstation or both, a major cost in test system, while providing for subsequent regeneration of the test results, either without loss, or with the loss of certain features immaterial to the application.

38 Claims, 8 Drawing Sheets

FIG. 2A

```
architecture tile2_a of tile2 is signal data_out:        bit_vector(data_bus_width-1 downto 0);
    signal data_oe:         bit;
    signal fault_strobe_ph1:bit;    -- Pipelined Fault Strobe
    signal x_addr_ph1:      bit_vector(x_addr_width-1 downto 0); --Pipelined x address
    signal y_addr_ph1:      bit_vector(y_addr_width-1 downto 0); --Pipelined y address --defect data for one row
    type x_record is record
        x_min:bit_vector(x_addr_width-1 downto 0); -- min defect address
        x_max:bit_vector(x_addr_width-1 downto 0); -- max defect address
        x_count:bit_vector(x_count_width-1 downto 0); -- defect count
    end record;

-- defect data for one column type y_record is record
        y_min:bit_vector(y_addr_width-1 downto 0); -- min defect address
        y_max:bit_vector(y_addr_width-1 downto 0); -- max defect address
        y_count:bit_vector(y_count_width-1 downto 0); -- defect count
    end record;
        type x_registers_array is array(0 to (2**y_addr_width)-1) of x_record;
        type y_registers_array is array(0 to (2**x_addr_width)-1) of y_record;

--X storage array
    signal x_array:x_registers_array;
--Y storage array
    signal y_array:y_registers_array;
```

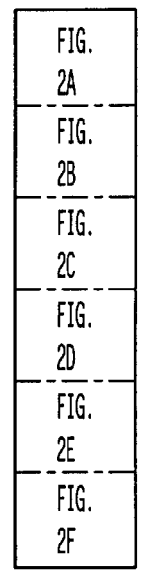

FIG. 2

| FIG. 2A |
| FIG. 2B |
| FIG. 2C |
| FIG. 2D |
| FIG. 2E |
| FIG. 2F |

```
                                       FIG. 2A
_____
-------------------------------------------------------------------
begin --readout data bus output tri-state buffer
g_data_bus: for i in 0 to data_bus_width-1 generate
g_triout:    triout port map (data_out(i).data_oe:data(i));
      end generate;
--fault logger
p_log: process(reset,write_clk)
      begin
-- Initialization on reset
      if(reset='1') then
          for i in 0 to (2**y_addr_width)-1
          loop
-- For procedure to work correctly, min address must be set to all ones
              x_array(i).x_min < = (others = > '1');
--For procedure to work correctly, max address must be set to all zeroes
              x_array(i).x_max < = (others = > '0');
-- Initial value of defect count - zero
              x_array(i).x_count < = (others = > '0');
          end loop;
          for i in 0 to (2**x_addr_width)-1
          loop
-- The same init procedure for Y array
              y_array(i).y_min < = (others = > '1');
              y_array(i).y_max < = (others = > '0');
              y_array(i).y_count < = (others = > '0');
          end loop;
          fault_strobe_ph1 < = '0'; -- Clear pipeline
      else
_____
                                       FIG. 2C
```

-- Compact REAM procedure
        if(write_clk' event and write_clk = '1') then
-- Advance the pipeline
        x_addr_ph1 < = x_fault_address(x_addr_width-1 downto 0);
        y_addr_ph1 < = y_fault_address(y_addr_width-1 downto 0);
        fault_strobe_ph1 < = fault_strobe;
-- If there is a Fault Strobe
        if(fault_strobe_ph1 = '1') then
--Increment defect counts
--bv2i - a function to convert bit_vector to integer
--(defined in package int_math, file lib_int.vhd)
        x_array(bv2i(y_addr_ph1)).x_count
          < = inc_bv(x_array(bv2i(y_addr_ph1)).x_count);
        y_array(bv2i(x_addr_ph1)).y_count
          < = inc_bv(y_array(bv2i(x_addr_ph1))).y_count;
-- If x address less than x_min , update x_min
        if(x_array(bv2i(y_addr_ph1)).x_min > x_addr_ph1) then
          x_array(bv2i(y_addr_ph1)).x_min < = x_addr_ph1;
        end if;
-- If x address greater than x_max , update x_max
        if(x_array(bv2i(y_addr_ph1)).x_max < x_addr_ph1) then
          x_array(bv2i(y_addr_ph1)).x_max < = x_addr_ph1;
        end if;
-- If y address less than y_min , update y_min
        if(y_array(bv2i(x_addr_ph1)).y_min > y_addr_ph1) then
          y_array(bv2i(x_addr_ph1)).y_min < = y_addr_ph1;
        end if;

```
                                              FIG. 2C
------------------------------------------------------------------
    -- If y address greater than y_max , update y_max
              if(y_array(bv2i(x_addr_ph1)).y_max < y_addr_ph1) then
                  y_array(bv2i(x_addr_ph1)).y_max < = y_addr_ph1;
              end if;
          end if;
      end if;
    end if;
end process;

--Readout stage
p_rdout:process(reset,read_clk)
        variable counter: integer;
        begin
           if(reset= '1') then'
                end_upload < = '0';  -- Clear Read Enable Out
                counter : = 0; -- Clear readout counter
           else
              if(read_clk'event and read_clk = '1')then
--If Read Enable In found, begin readout sequence
                  if(start_upload = '1' and end_upload = '0') then
                       data_oe < = '1';  -- Enable tri-state bus
--X array comes out first, starting from row number 0.
--Data word format:
--lowest x_count_width bits - defect count
--next x_addr_width bits - max defect address
------------------------------------------------------------------
                                              FIG. 2E
```

FIG. 2E

```
                                                    FIG. 2D
─────────────────────────────────────────────────────────────
    --next x_addr_width bits - min defect address
                if(counter < 2**y_addr_width) then
                    data_out(x_count_width + 2*x_addr_width-1
                        downto x_count_width + x_addr_width)
                        < = x_array(counter).x_min;
                    data_out(x_count_width + x_addr_width-1 downto x_count_width)
                        < = x_array(counter).x_max;
                    data_out(x_count_width-1 downto 0)
                        < = x_array(counter).x_count;
                    counter : = counter + 1;
    --Y array comes next, in the same format
                elsif(counter < 2**x_addr_width + 2**y_addr_width) then
                    data_out(y_count_width + 2*y_addr_width-1
                        downto y_count_width + y_addr_width)
                        < = y_array(counter-2**y_addr_width).y_min;
                    data_out(y_count_width + y_addr_width-1 downto y_count_width)
                        < = y_array(counter-2**y_addr_width).y_max;
                    data_out(y_count_width-1 downto 0)
                        < = y_array(counter-2**y_addr_width).y_count;
                    counter : = counter + 1;
                end if;
─────────────────────────────────────────────────────────────
                                                    FIG. 2F
```

FIG. 2F

```
                                           FIG. 2E
-- When everything has been read out, generate Read Enable out and free data bus
            if(counter = 2**x_addr_width +2**y_addr_width) then
               end_upload < = '1';
            end if;
         end if;
       end if;
     end if;
   end process;
 end tile2_a;
```

FIG. 3

```
const DefectsArray.Default_Size=4095;
Array of integer:      X[0:Default_Size], Y[0:Default_Size];
Array of integer:      Xe[0:Default_Size, 1:Nx], Ye[0:Default_Size,1:Nx];
Array of bit:   Error_log[0:Default_Size,0:Default_Size];
{*** Initialisations ***}
Xe=0; Ye=0;
X=0; Y=0;
{*** Simulate compression hardware ***}
for each defect{
      X[x_addr]++;
      Y[y_addr]++;
      if (Xe[x_addr,lowest] < y_addr) then Xe[x_addr,lowest] = y_addr;
      if (Xe[x_addr,highest] > y_addr) then Xe[x_addr,highest] = y_addr;
      if (Ye[y_addr,lowest] < x_address) then Ye[y_addr,lowest] = x_addr;
      if (Ye[y_addr,highest] > x_addr) then Ye[y_addr,highest] = x_addr
};
{*** decompress fault data ***}
      {*** sorts X and Y into descending order by the defect count ***}
      X.sortbynumber (); Y.sortbynumber ();
      for (1=0; i<Default_Size;i++) {
            if (Xe[x_addr,highest] - Xe[x_addr,lowest] > 2 and
                (X[x_addr]>Y[y_addr]) {
                  if Y[y_addr] > 0 then for span of X, Y[y_addr] --;
                  if X[x_addr] > 0 then for span of Y, X[x_addr]--
            }
Error log = 1 for all spans for all remaining counts for which X or Y > 0.
```

SYSTEM AND A METHOD FOR PROCESSING INFORMATION ABOUT LOCATIONS OF DEFECTIVE MEMORY CELLS AND A MEMORY TEST WITH DEFECT COMPRESSION MEANS

FIELD OF THE INVENTION

The present invention relates to a system for, and a method of, processing information about the locations of defective memory cells. In particular, the invention relates to a system for, and a method of, storing the locations of defective memory cells received from a memory test system so that the size of the memory required for storing the locations is reduced.

BACKGROUND OF THE INVENTION

In the memory manufacturing industry, memory cells on a memory device (such as a semiconductor memory) are tested after fabrication of the device.

Conventionally, memory devices have a main memory comprising a large number of memory cells, and also a small number of redundant memory cell structures which can be substituted for any defective memory cells in the main memory. During the test process, the location of defective cells in the main memory is identified in order that through a process of redundancy allocation, these redundant memory cell structures can be configured to replace the defective cells in the main memory.

Other applications of memory test include the examination of electrical or functional parameters of the memory for engineering or quality control purposes, or verification of the operation of the memory.

Test systems used for testing memory devices must be able to test each new generation of memory devices at the maximum speed of the new device. The test systems must also be able to record a large number of locations. These factors combine to create a requirement for a large and expensive memory (called the fault capture memory or error catch RAM) in test systems because the fault capture memory must be the same size and operate at the same speed as the memory device under test. Some systems have used FIFOs to reduce the amount of RAM, but this still requires a large memory in the control system to which the tester is connected to process or view the defect data.

When the latest generation of memory devices is manufactured, there must be a test system available which is capable of testing these new memory devices; however, these test systems must be fabricated using the previous generation of memory devices. To enable the test systems to operate effectively, the requirement for storing the locations of defective cells is met by emulating the fault generating capacity of the new memory devices to be tested using arrays of smaller (previous generation) memory devices having the fastest timing characteristics available for those (previous generation) devices.

For example, a test system having 256 pins, testing sixteen 256 Mbit capacity memory devices, each device being organised as 16 M×16 bits, will require 4 Gbits (256 pins×16 Mb) of high speed fault capture memory to obtain single bit resolution, or if the 2 least significant address bits are ignored to obtain a 4×4 cell resolution, 1 Gbit of high speed memory. A 1024 pin tester would require 4 Gbit of high speed fault capture memory at the same defect resolution (a 4×4 cell) but this would test sixty-four 256 Mbit capacity memory devices.

This high speed fault capture memory (also called defect store memory) normally comprises Static Random Access Memory (SRAM) and can cost 30% of the total hardware cost of the test system. It is therefore highly desirable to be able to reduce the amount of fault capture memory required.

One proposed solution, which is used in some test systems, is to maintain a list of defects rather than a full map (which would indicate for each cell whether that cell is working or defective). However, this list overflows when the test system is testing a number of memory devices concurrently and one or more of those memory devices contains a large number of defects. When the list overflows, either the test sequence must be interrupted or some defect data must be discarded. Also, the controller to which the tester is attached still requires a large amount of memory, and the transfer of the data to the controller is slow.

Another prior art solution is to capture a 1:1 bitmap from the tester, requiring a large amount of storage in the tester and in a computer to which it is linked, and then to apply digital signal processing techniques to filter the data. This produces a system with negative losses, that is, it loses some of the original data, limiting its application. Even with a communication channel between the tester and computer operating at very high speed, this solution is slow because of the volume of data involved.

SUMMARY OF THE INVENTION

It is an object of the present invention to obviate or mitigate at least one of the disadvantages of the aforementioned systems.

This is achieved by using a compression means with defined zero to positive loss characteristics on data restoration to act on the defect data to create a representation of the fail bit map data which is a compressed form of the original data. This allows the lossless restoration of the original data, or a lossy reconstruction of the original data where additional defects may be apparent, as required by the application and the exact implementation chosen for the compression means.

This reduces the size of or obviates the fault capture memory in the memory test system, either in the tester or in the controller or workstation or both. This provides the principal advantages of reduced test hardware cost, faster test result downloads, support of fast browsing capabilities in workstations or computers accessing the compressed defect data, and fast selective retrieval from databases employing the compressed defect data.

The compression can be effective by using the fact that defective memory cells are distributed preponderantly along rows and columns in a memory device. Thus, where a fault occurs in one cell of a row or column, there is a much higher probability of there being another fault manifest as a dysfunction in another cell in the same row or column. The data compression means of many of the preferred embodiments uses this phenomenon to record the row or column that is defective, and optionally the tile, along with a compressed form of the locations affected.

Various statements of invention corresponding to the subject matter in the independent claims and the dependent claims, based on the entire disclosure of the specification are incorporated herein by reference.

BRIEF DESCRIPTION OF THE DRAWINGS

For a better understanding of the present invention and to show how the same may be carried into effect, reference will now be made, by way of example, to the accompanying drawing in which:

FIGS. 2A–2F shows a VHDL description of an embodiment of the compression means in FIG. 1;

FIG. 3 is a procedure for reconstructing the defect map for defects compressed using the compression means of FIG. 1.

DETAILED DESCRIPTION OF THE PREFERRED EMBODIMENTS

Figure 1:
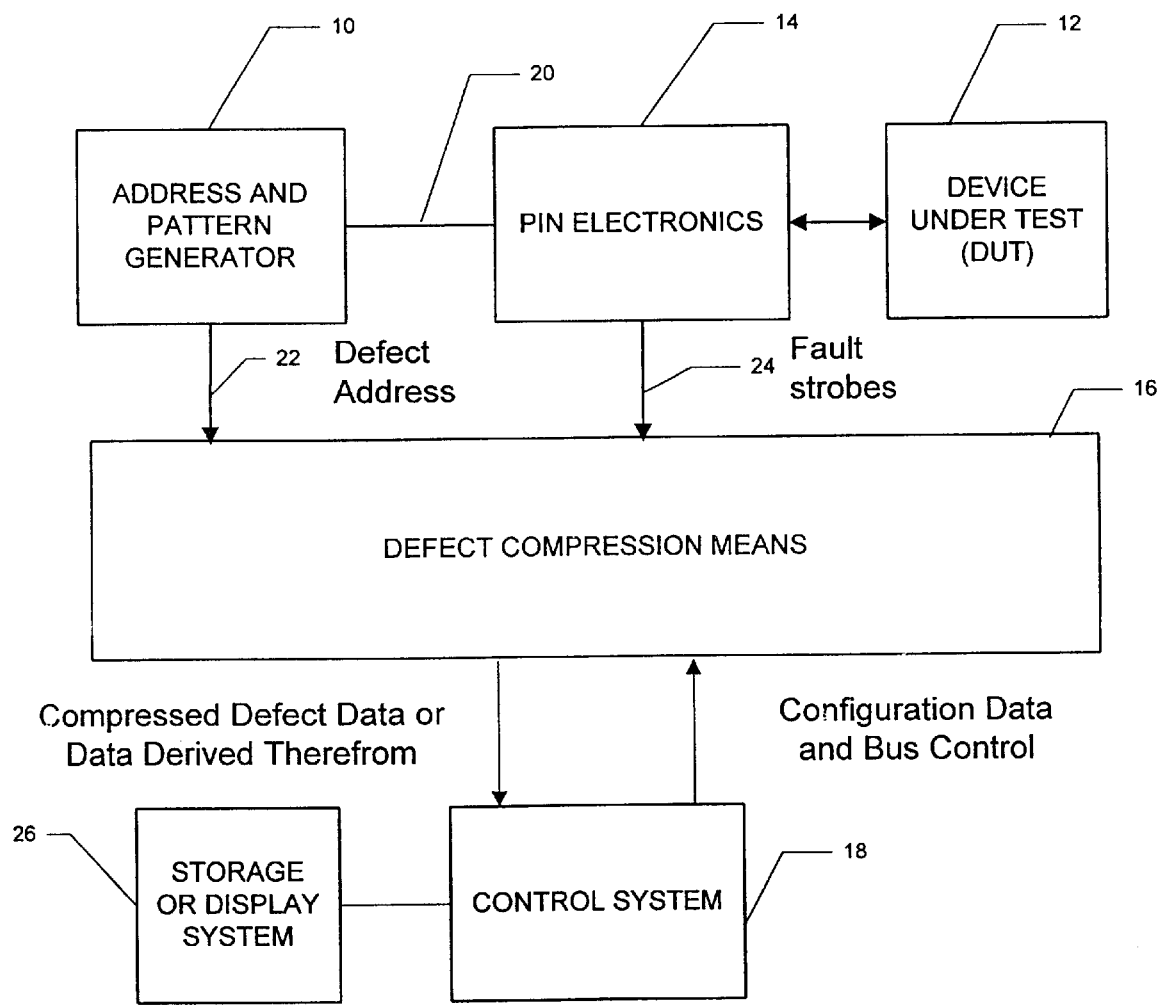
FIG. 1 is a block diagram of a memory test system according to an embodiment of the present invention.

FIG. 1 is a block diagram of a memory test apparatus in which an address and pattern generator 10 is connected to a memory device under test 12 via a pin electronics 14, where the addresses and fault strobes from the pattern generator and pin electronics respectively are linked by hardware or software depending on the application to a defect compression means 16 under control of a control system 18 typically implemented by a personal computer or workstation. The address and pattern generator 10 determines which memory cells are to be tested by the pin electronics 14 by conveying a cell address to the driver circuitry of the pin electronics 14 by bus 20.

A standard memory test apparatus would have a fault capture memory instead of the data compression means 16; however, in this embodiment of the present invention the fault capture memory has been replaced by the data compression means 16.

The combination of the address and pattern generator 10 and the pin electronics 14 tests memory cells in the device under test 12 by applying signals to the device 12 as a series of write cycles followed by read cycles in which the data read is compared with a reference set of data, typically sent to the pin electronics at the time the address and patterns are generated. Where the stored reference data differs from the data read from the memory device, a fault strobe is generated. The fault strobe causes the location of the defect to be stored either by setting a bit in a bitmap in the pin electronics 14 head, or by causing the address and other information to be latched into a shift register such as a FIFO (not shown in the interest of clarity), located typically in the pin electronics test head. In this embodiment, the depth of the bitmap or FIFO can be reduced down to one register instead of that normally used as fault capture memory depending on the speed of the compression system. With a slower compression means, for example, lossless compression using software emulation of a process described by this invention, the pin electronics head may require a large FIFO or a large amount of bitmap storage, but this invention reduces the amount of storage required in the control system subsequently.

When a defect has been detected by the assertion of the fault strobe, the address and pattern generator supplies the cell address to the data compression means 16 via address bus 22. The pin electronics 14 supplies fault signals to the compression means 16 via a control bus 24 when a memory cell fails a test. Alternatively the address data may be available as the offset in a stream of bitmap data issued with each clock cycle of a device in the pin electronics wherein a logical 1 represents a failure of that bit, and a logical zero represents a pass, or vice versa.

The data compression means 16 receives the fault signals from the pin electronics 14 and an address from the address and pattern generator 10 corresponding to the defective cell.

The compression means 16 creates a representation of the received data, the representation being a compressed form of the original data. The process of converting the original data into a compressed format may allow either lossless restoration of the original data or restoration with the losses, where losses mean additional defects appearing during the restoration process as a product of ambiguities created by the compression mean. The choice of lossless or lossy compression is determined by the application: for example, a lossless system is slower to execute than a lossy system and lends itself to applications requiring the engineering analysis of the reconstructed bitmaps. A lossy system can operate in real time and is suited to applications involving the automatic processing of the reconstructed data, either fully or partially reconstructed, such as in redundancy allocation where spare elements are configured to replace defective regions based on the defect distribution across the memory device under test.

The compression means 16 sends the compressed data to the control system, 18 or storage system or a display system 26. The control system runs decompression software, an example of which will be described, to decompress all or part of the data to provide a defect map or a reconstructed bitmap of the memory that was tested.

The control system 18 via its integral user interface enables a user to view, evaluate or process the information stored. The control system may also have an interface for coupling to a redundant structure programmer to allow programming of redundant memory cell structures on the device under test 12.

The function and operation of the compression means 16 is described by the VHDL in FIG. 2.

The VHDL description (Very high speed integrated circuit Hardware Description Language) shown in FIG. 2 adopts an industry wide method of describing electronic logic circuits. VHDL is an IEEE Standard Hardware Description Language commonly used by electronic hardware designers for representing the function and structure of a circuit. A VHDL description has a definite implied architecture expressing both function and sufficient implementation information for any of the commercial ASIC houses to manufacture. (See IEEE Standard VHDL Language Reference Manual Std 1076-1987, IEEE New York, 1988; and IEEE Standard VHDL Language Reference Manual Std 1076-1993, IEEE New York, 1994; and also Hunter R and Johnson T, "Introduction to VHDL", Chapman & Hall, London, 1996 ISBN 0-412-73130-4 and other references given in Appendix 1).

A device described by a VHDL listing is manufactured by logic synthesis using any of a wide range of standard commercially available packages such as those provided Synopsis Inc, Cadence and Compass Design Automation, as well as virtually all silicon vendors for use with their proprietary silicon products. Synthesis is an automated mechanism to generate an optimised gate-level representation from a VHDL description.

The VHDL can be used directly by simulation or emulation tools. The function described by the VHDL is apparent to any engineer operating in this field. VHDL has been taught to most engineers and computer scientists in undergraduate courses worldwide for at least the past decade.

The function and operation of the compression means 16 described by the VHDL in FIG. 2 will now be presented also in plain text for ease of understanding.

The input to the compression procedure is a stream of defect locations (X-Y pairs), signaled by an address with a fault strobe.

The compression means 16 operates on rectangular regions of the DUT DQ plane, ideally one region being one memory tile. The finer this subdivision of the plane into tiles, the greater the accuracy of the restoration of the original defect map, but the larger the data structures that must be used.

For every row and column of the tile, three numbers are stored: the minimum fault address, the maximum fault address and the count of faults falling between these two end points. This data structure is called a span. Two arrays of spans (one for rows and another for columns) are used for each tile.

Even if a row or a column has a large number of faults, all these faults are still represented by only three numbers, resulting in a very high compression ratio compared to a raw defect map.

The steps involved in the compression procedure are:

1. Before receiving fault data, all storage elements must be initialized. The minimum address of each span is set to the length of tile row/column minus 1, while the maximum address and fault count are set to zero. Thus, the address of the first fault is always less than the initial minimum address and the maximum address is always greater than the initial maximum address, ensuring that the first fault is handled correctly.
2. Incoming X and Y addresses are decoded to find a tile, and two spans (row and column) within this tile.
3. When a fault hits row number Y and column number X, the X value is compared with the XMIN and XMAX values already scored in the row span These functions are carried out in a structure termed a slice: this is one register block in the X and Y storage arrays in the VHDT. The possible slice states and the resulting update actions are described in the table below.

TABLE 1

Slice Update Functionality

| Comparison result | XMIN <= | XMAX <= | Counter <= |
|---|---|---|---|
| X < XMIN, X > XMAX (1st | X | X | increment |
| X = XMIN, X = XMAX | no change | n.c. | n.c. |
| X < XMIN, X < XMAX | X | n.c. | increment |
| X = XMIN, X < XMAX | n.c. | n.c. | n.c. |
| X > XMIN, X < XMAX | n.c. | n.c. | increment |
| X > XMIN, X = XMAX | n.c. | n.c. | n.c. |
| X > XMIN, X > XMAX | n.c. | X | increment |

Similar actions are performed simultaneously for the column address Y.

The slice counter value is limited in the example embodiment to the level of ¼ of row/column length. If this number is exceeded, in the redundancy allocation application for which this particular compression is optimised, the row or the column must be mapped out during the redundancy allocation anyway. The slice counter does not roll over, but keeps its maximum value until reset.

For further clarity, a fragment of C source implementing the same compression procedure as the VHDL is shown below.

```
// Initialize storage arrays
    for ( row=0; row<nRows; row++ )
        {
            RowSpan[row] .Begin=nCols-1;
            RowSpan[row] .end=0;
            RowSpan[row] .Count=0;
```

-continued

```
        }
    for ( column=0; column<nCols; column++)
        {
            ColSpan[column] .Begin=nRows-1;
            ColSpan[column] .End=0;
            ColSpan[column] .Count=0;
        }
// Process defect list
    while (Defect_list_not_empty)
        {
            Get_next_defect ( &column, &row );
// Update the row span
            if (RowSpan[row] .Begin > column)      // If necessary,
                RowSpan[row] .Begin = column;      // update left end
            if (RowSpan[row] .End < column )       // If necessary,
                RowSpan[row] .End = column;        // update right end
// Check conditions when the counter must not be incremented
            if ( !(RowSpan[row] .Begin == column
                    RowSpan[row] .End == column
                    RowSpan[row] .Count == MaxCount) )
// If none of them true, increment the counter
                RowSpan[row] .Count++;
// Do the same for the column span
            if ( ColSpan[column] .Begin > row )
                ColSpan[column] .Begin = row;
            if ( ColSpan[column] .End < row )
                ColSpan[column] .End = row;
            if ( !(ColSpan[column] .Begin == row ||
                    ColSpan[column] .End == row ||
                    ColSpan[column] .Count == MaxCount) )
                ColSpan[column] .Count++;
        }
```

It will be appreciated that this fragment may be written in any other suitable programming language, such as PASCAL, APL, FORTRAN, or Smalltalk etc. The output of this procedure is an array of spans termed a Symbolic Map, because it contains information on the defects in a symbolic state. The span location is encoded by its serial number in the symbolic map. If only significant spans with a non-zero fault count are transmitted to the host, this serial number must be added as a fourth field to the span data.

In practice, the symbolic maps are decompressed from the lossy format into sparse bit matrices themselves, a form of compression, and are never fully reconstructed as 1:1 bitmaps. However, to facilitate understanding of the decompression procedure for the compressed data from the compression means in this example embodiment, we shall assume that a 1:1 bitmap is to be reconstructed from the symbolic map.

Symbolic maps for each tile are processed independently by the reconstruction procedure. The procedure in this embodiment consists of a sequence of several passes, each of them incrementally adding defects to the restored defect list. During the decompression, the symbolic map is overwritten.

Pass 1

Mark single points (spans with fault count equal to one). Three cases are possible, distinguished by the length and the position of the span in the two orthogonal directions.

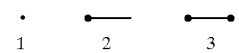

1    2    3

1. Isolated point—in both directions the counters are
   1. The point is added to the defect list and both spans are deleted from the span list by assigning 0 to the counters.

2. The point is an end of the orthogonal span, with the fault count greater than or equal to 2. The point is added to the defect list. The current span is deleted. Nothing is done to the orthogonal span.
3. The point is in the middle of the orthogonal span. The point is added to the defect list, the current span is deleted and the counter of the orthogonal span is decremented.

The pass is performed first for row and then for column spans.

Pass 2

Process spans with counter equal 2. Again, three cases are possible for each end of the span.

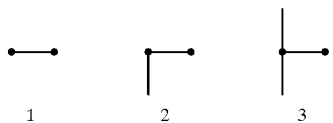

1. No span in the perpendicular direction (there was a span of length 1, but it was deleted during pass 1). Do nothing, since this point is already in the defect list.
2. The point is an end of the orthogonal span, with count greater than or equal to 2. The point is added to the defect list. Nothing is done to the orthogonal span.
3. The point is in the middle of the orthogonal span. The point is added to the defect list and the counter of the orthogonal span is decremented.

In all cases the current span is deleted (0 assigned to the span defect counter).

The pass is performed first for row and then for column spans.

After pass 2, new spans with counter=2 may appear, as a result of case 3. Several iterations of pass 2 must be made, until there are no more such spans left.

Pass 3

Now only spans with the span counter>=3 are left. The only action performed in pass 3 is to add their ends to the defect list.

Pass 4

Intersections of all remaining spans are added to the defect list.

Various simple examples are given below to demonstrate compression and recovery, i.e. decompression, procedures.

EXAMPLE 1

A Single Point on Column Number X and Row Number Y

This defect is coded into two spans: a row span containing (X,X,1) and a column span containing (Y,Y,1).

In this case the original defect is found during pass 1 of the recovery procedure.

EXAMPLE 2

A Continuous Span in the X Direction (X1, Y) (X2, Y)

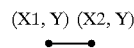

The result of the compression is one row span containing (X1,X2,X2-X1) and X2-X1 column spans, each containing (Y,Y,1). All defects are found during pass 1, because all column spans have the span counter equal to 1. Even if there are working cells inside the span (i.e., it is not continuous), the procedure still restores 100% of the original defects, without adding any extra.

EXAMPLE 3

Five Defects Forming Two Crossing Spans

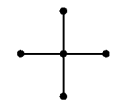

The symbolic map contains three row spans and three column spans. End points are found during pass 1. The point on the intersection is marked during pass 4.

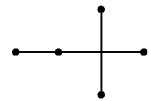

All points are marked during pass 1 and the counter of the row span is decremented from 3 to 2. Then both spans are deleted during pass 2. No extra point is marked on the intersection.

Using the compression procedure of the example embodiment, it is not always possible to determine from the information stored the precise location of each defective cell. In this case, retrieval of the locations of defective cells is limited to the number of defects in a row or column, and a list of alternative positions in which the defect may occur. In many applications, including redundancy allocation, this is not significant because any row or column which has a large number of defective cells will be replaced.

Another embodiment of the compression system provides for a compression of the defects for the rows and columns in each tile rather than the rows and columns extending across the entire memory. In this alternative embodiment redundant memory cell structures are allocated for each group of rows and columns in each tile. Where the number of tiles is more than the number of sets of redundant structures, the tiles can be regarded as a hierarchical group and the hardware applied to clusters of tiles, with increased losses, that is with additional ambiguity as to the exact location of some defects.

Various modifications can be made to the embodiments here and before described without departing from the scope of the present invention. For example, in other embodiments, the fault signals may be generated by the address and pattern generator 10 rather than the pin electronics 14. In addition, a count of defective cells between the maximum faulty address and the minimum faulty address may not be used, a sparse bit matrix or a corner stitched structure may be used instead to provide lossless compression. Where the compression means operates slowly, it is necessary to retain some fault capture memory or a FIFO. In this case, the defect compression means can operate to reduce the retrieval times or display times for the bitmaps. In these cases, the defect compression means may be retrofitted to existing test systems.

The example embodiment using VHDL can also be expressed by automated translation into either Verilog or circuit diagrams. Verilog is a de-facto standard, widely used as an alternative to VHDL throughout the semiconductor industry, with some advantages for specific applications (Appendix 1).

In each of the main embodiments and the alternative embodiments, the decompression means matches the compression means. The term coupled as used herein means any connection whether direct or indirect, and whether by hardware or software or a combination thereof.

APPENDIX 1

VHDL References:

IEEE Standard VHDL Language Reference Manual, Std 1076-1987, IEEE, New York, 1988.

IEEE Standard VHDL Language Reference Manual, Std 1076-1993, IEEE, New York, 1994.

Hunter, R. and Johnson, T., Introduction to VHDL, Chapman & Hall, London, 1996, ISBN 0-412-73130-4.

Pick, J., HVDL Techniques, Experiments, and Caveats, McGraw-Hill, New York, 1996, ISBN 0-07-049906-3.

Bhaster, J., A VHDL Primer, Star Galaxy Press, PA, 1996, ISBN 0-9650391-0-2.

Bhaster, J., A Guide to VHDL Syntax, Prentice Hall, NJ, 1995, ISBN 0-13-324351-6.

Skahill, K., VHDL for Programmable Logic, Addison Wesley, CA, 1996, ISBN 0-201-89586-2.

Companies offering a fabrication service from VHDL descriptions:

Orbit Semiconductor, Atmel #, LSI Logic Inc, TSMC (Taiwan), UMC (Taiwan), Altera, Lattice Semi, Cypress Semiconductor Corp, Xilinx and more than 20 others.

VHDL and Verilog References:

Smith, D., HDL Chip Design, Doon Publications, AL, 1996, ISBN 0-9651934-3-8.

Verilog References:

Bhaster, J., A Verilog HDL Primer, Star Galaxy Press, PA, 1997, ISBN 0-9656277-4-8.

Palnitkar, S., Verilog HDL: A Guide to Digital Design And Synthesis, Prentice Hall, NJ, 1996, ISBN 0-13-451675-3.

Thomas, D. and Moorby, P., The Verilog Hardware Description Language, Third Edition, Kluwer Academic Publishers, MS, 1997.

IEEE Standard Hardware Description Language Based on the Verilog Hardware Description Language, IEEE Std 1364–1995, IEEE, New York, 1995.

What is claimed is:

1. A system for processing information about locations of defective memory cells in a memory, the system comprising:

a) an address receiving means for receiving addresses corresponding to the locations of said defective memory cells, b) a compression means for creating a compressed representation of data, the compression means being coupled to the address receiving means whereby after receipt of the addresses the compression means creates a representation of the received data, the representation being a compressed form of the original data allowing at least the lossless reconstruction of the original data.

2. A system as claimed in claim 1, wherein the reconstruction of the original data comprises restoration of the original data with additional defects which may be created during the restoration process.

3. A system as claimed in claim 1 wherein at least one of the said means is implemented in hardware.

4. A system as claimed in claim 1 wherein at least one of the said means is implemented in software.

5. A system as claimed in claim 1 wherein the system further contains a storing means for storing the compressed representation, the storing means being adapted to store information from said memory after test has occurred.

6. A system as claimed in claim 1 wherein the said compression means is configured to provide the output representation of the original data as a sparse bit matrix.

7. A system as claimed in claim 1 wherein the said compression means is configured to provide the output representation of the original data as a corner stitched data structure.

8. A system as claimed in claim 1, further including a decompression means for receiving said compressed data and for providing reconstruction of the original data, the decompression means operating in conjunction with the compression means.

9. A system as claimed in claim 8 wherein the decompression means selectively retrieves said process data and provides selective decompression to browsers, processing programs or databases.

10. A system as claimed in claim 8 wherein at least one of the said means is implemented in hardware.

11. A system as claimed in claim 8 wherein at least one of the said means is implemented in software.

12. A system as claimed in claim 8 wherein at least one of the said means is coupled to another by hardware.

13. A system as claimed in claim 8 wherein at least one of the said means is coupled to another by software.

14. The system according to claim 1, wherein the compression means creates a representation of a failed bit map, the representation being a compressed form of the received addresses corresponding to the locations of the defective memory cells, the representation being a compressed form allowing the reconstruction of the failed bit map.

15. The system according to claim 14 further comprising a decompression means for reconstructing the failed bit map.

16. A computer readable memory operable in a conventional computer, the computer readable memory comprising a computer readable program code means for implementing or emulating or simulating the hardware functions of a system for processing information about locations of defective memory cells in a memory, the computer readable program means comprising:

a) a computer readable address receiving pro gram code means for receiving addresses corresponding to the locations of said defective memory cells, b) a computer readable compression program code means for creating a compressed representation of data, the compression program code means being coupled to the address receiving means whereby after receipt of the addresses, the compression means creates a representation of the received data, the representation being a compressed form of the original data allowing at least the lossless reconstruction of the original data.

17. A computer readable memory as claimed in claim 16, further comprising a computer readable decompression program code means for receiving said compressed data and for providing reconstruction of the original data, the computer decompression means operating in conjunction with the computer compression means.

18. The computer readable memory according to claim 16, wherein the compression program code means creates a representation of a failed bit map, the representation being a compressed form of the received addresses corresponding to the locations of the defective memory cells, the representation being a compressed form allowing the reconstruction of the failed bit map.

19. The computer readable memory according to claim 18 further comprising a computer readable program code means for reconstructing the failed bit map.

20. A method of processing information about locations of defective memory cells in a memory, comprising the steps of:

a) receiving address data corresponding to the locations of defective memory cells, b) creating a representation of the received data by compressing the original data into a compressed representation, c) storing the compressed representation or a derivative thereof in a format which allows the lossless reconstruction of the original data.

21. A method as claimed in claim 20, wherein the reconstruction of the original data comprises restoration of the original data with additional defects which may be created during the restoration process.

22. A method as claimed in claim 20 wherein the memory test data are processed when said memory is under test.

23. A method as claimed in claim 20 wherein the memory test data are processed after test has occurred.

24. The method according to claim 17, wherein the creating step comprises creating a representation of a failed bit map, the representation being a compressed form of the received addresses corresponding to the locations of the defective memory cells, the representation being a compressed form allowing the reconstruction of the failed bit map.

25. The method of claim 24 further comprising reconstructing the failed bit map data based on the compressed data.

26. A computer readable memory operable in a conventional computer, the computer readable memory comprising a computer program for performing a method of processing information about locations of defective memory cells in a memory, comprising;
   a) a computer readable program means for receiving address data corresponding to the locations of defective memory cells,
   b) a computer readable program code means for creating a representation of the received data by compressing the original data into a compressed representation,
   c) a computer readable program code means for storing the compressed representation or a derivative thereof in a format which allows the lossless reconstruction of the original data.

27. A computer readable memory as claimed in claim 26, wherein reconstruction of the original data comprises restoration of the original data with additional defects which may be created during the restoration process.

28. The computer readable memory according to claim 26, wherein the program code means for creating a representation of received data creates a representation of a failed bit map, the representation being a compressed form of the received addresses corresponding to the locations of the defective memory cells, the representation being a compressed form allowing the reconstruction of the failed bit map.

29. The computer readable memory according to claim 28, further comprising a computer readable program code means for reconstructing the failed bit map data.

30. A solid state memory test apparatus for testing memory devices, the apparatus comprising:
   an address and pattern generator for addressing a plurality of storage locations to be tested,
   a means for testing storage locations in a memory device and creating information about defective storage locations,
   a system for processing information about locations of defective memory cells in a memory device, wherein the processing system includes an address receiving means, a storing means, and a hardware defect compression means for compressing data in a form which permits reconstruction of said information about locations of defective memory cells.

31. An apparatus as claimed in claim 30, further comprising a means for accomplishing a redundancy allocation at least partially, the redundancy allocation means operating in conjunction with the hardware defect compression means.

32. An apparatus as claimed in claim 30 with the compression means allocated as a set of hardware resources for each tile in the memory under test.

33. A solid state memory test apparatus for testing memory devices, the apparatus comprising:
   an address and pattern generator for addressing a plurality of storage locations to be tested,
   a means for testing storage locations in a memory device, and creating information about defective storage locations,
   a system for processing information about locations of defective memory cells in a memory device, wherein the processing system includes an address receiving means,
   wherein the hardware defect compression means creates a representation of a failed bit map, the representation being a compressed form of the received addresses corresponding to the locations of the defective memory cells, the representation being a compressed form allowing the reconstruction of the failed bit map.

34. The solid state memory according to claim 33 further comprising a decompression means for reconstructing the failed bit map data.

35. A method of testing a memory for obtaining information about locations of defective memory cells, the method including:
   generating addresses and patterns for accessing a plurality of memory cells to be tested,
   testing the memory cells in a memory device and creating information about defective storage locations,
   processing information about locations of defective memory cells in a memory device, wherein the operation of processing includes a step of receiving addresses, a step of compressing the defect data in a form which permits reconstruction of said information about locations of defective memory cells and a step of storing the compressed data.

36. A solid state memory test apparatus for testing memory devices, the apparatus comprising:
   an address and pattern generator for addressing a plurality of storage locations to be tested,
   a means for testing storage locations in a memory device, and creating information about defective storage locations,
   a system for processing information about locations of defective memory cells in a memory device, wherein the processing system includes an address receiving means,
   wherein the said hardware compression means is supported by a software tool for regenerating the original defect map or a derivative of said defect map.

37. A method of testing a memory for obtaining information about locations of defective memory cells, the method including:
   generating addresses and patterns for accessing a plurality of memory cells to be tested,
   testing the memory cells in a memory device and creating information about defective storage locations,
   processing information about locations of defective memory cells in a memory device, wherein the operation of processing includes a step of receiving addresses, a step of compressing the defect data and a step of storing the compressed data, wherein the step of compressing defect data comprises creating a representation of a failed bit map, the representation being a compressed form of the received addresses corresponding to the locations of the defective memory cells, the representation being a compressed form allowing the reconstruction of the failed bit map.

38. The method according to claim 37 further comprising reconstructing the failed bit map data from the compressed data.

* * * * *